(12) United States Patent
Kamikawa et al.

(10) Patent No.: US 8,368,095 B2
(45) Date of Patent: Feb. 5, 2013

(54) NITRIDE SEMICONDUCTOR LIGHT EMITTING DEVICE AND METHOD OF FABRICATING NITRIDE SEMICONDUCTOR LASER DEVICE

(75) Inventors: Takeshi Kamikawa, Mihara (JP); Yoshinobu Kawaguchi, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/638,582

(22) Filed: Dec. 14, 2006

(65) Prior Publication Data

US 2007/0138492 A1 Jun. 21, 2007

(30) Foreign Application Priority Data

Dec. 16, 2005 (JP) .................................. 2005-363590
Nov. 28, 2006 (JP) .................................. 2006-320327

(51) Int. Cl.
*H01L 33/00* (2010.01)

(52) U.S. Cl. ................ 257/98; 257/13; 257/79; 257/94; 257/E33.025; 257/E33.028; 257/E33.03; 257/E33.033; 257/E33.034; 257/E33.06; 257/E33.067; 257/E33.068; 257/E33.069

(58) Field of Classification Search ........... 257/E33.034, 257/E33.03, E33.025, 13, 79, 94, 98, E33.028, 257/E33.033, E33.06, E33.067, E33.068, 257/E33.069

See application file for complete search history.

(56) References Cited

U.S. PATENT DOCUMENTS

| | | | |
|---|---|---|---|
| 3,629,088 A | | 12/1971 | Frank et al. |
| 5,196,958 A | * | 3/1993 | Verbeek et al. ............... 359/344 |
| 5,231,062 A | | 7/1993 | Mathers et al. |
| 5,741,724 A | | 4/1998 | Ramdani et al. |
| 5,777,792 A | * | 7/1998 | Okada et al. .................. 359/584 |
| 6,249,534 B1 | | 6/2001 | Itoh et al. |
| 6,370,177 B1 | | 4/2002 | Genei et al. |
| 6,667,187 B2 | | 12/2003 | Genei et al. |
| 6,744,076 B2 | | 6/2004 | Fukuyama et al. |
| 6,812,152 B2 | | 11/2004 | Lindström et al. |
| 6,961,359 B2 | | 11/2005 | Tojo et al. |

(Continued)

FOREIGN PATENT DOCUMENTS

| | | |
|---|---|---|
| JP | 59-092593 | 5/1984 |
| JP | 03-049281 | 3/1991 |

(Continued)

OTHER PUBLICATIONS

Machine Translation of JP 2005-340625, Fujimura Yasushi, "Nitride Semiconductor Laser Device", Dec. 8, 2005.*

(Continued)

*Primary Examiner* — Jay C Kim
(74) *Attorney, Agent, or Firm* — Harness, Dickey & Pierce, P.L.C.

(57) ABSTRACT

There is provided a nitride semiconductor light emitting device having a light emitting portion coated with a coating film, the light emitting portion being formed of a nitride semiconductor, the coating film in contact with the light emitting portion being formed of an oxynitride. There is also provided a method of fabricating a nitride semiconductor laser device having a cavity with a facet coated with a coating film, including the steps of: providing cleavage to form the facet of the cavity; and coating the facet of the cavity with a coating film formed of an oxynitride.

17 Claims, 6 Drawing Sheets

U.S. PATENT DOCUMENTS

| | | |
|---|---|---|
| 7,564,884 B1 | 7/2009 | Ito et al. |
| 2002/0006726 A1 | 1/2002 | Yamasaki et al. |
| 2002/0024981 A1 | 2/2002 | Tojo et al. |
| 2002/0075928 A1 | 6/2002 | Genei et al. |
| 2003/0015713 A1 | 1/2003 | Yoo |
| 2003/0015715 A1* | 1/2003 | Sakai ........................ 257/79 |
| 2003/0048823 A1 | 3/2003 | Yamanaka |
| 2003/0156614 A1 | 8/2003 | Ueda et al. |
| 2003/0210722 A1 | 11/2003 | Arakida et al. |
| 2004/0026710 A1 | 2/2004 | Tsuda et al. |
| 2004/0165635 A1* | 8/2004 | Sugimoto et al. ............... 372/46 |
| 2004/0190576 A1 | 9/2004 | Matsuoka et al. |
| 2004/0213314 A1 | 10/2004 | Kunitsugu et al. |
| 2004/0238810 A1 | 12/2004 | Dwilinski et al. |
| 2004/0238828 A1 | 12/2004 | Ito |
| 2004/0245535 A1 | 12/2004 | D'Evelyn et al. |
| 2004/0252622 A1 | 12/2004 | Kariyada |
| 2005/0032344 A1 | 2/2005 | Hatano et al. |
| 2005/0059181 A1 | 3/2005 | Yamane et al. |
| 2005/0104162 A1 | 5/2005 | Xu et al. |
| 2005/0127383 A1 | 6/2005 | Kikawa et al. |
| 2005/0281304 A1 | 12/2005 | Mochida |
| 2006/0093005 A1 | 5/2006 | Okunuki et al. |
| 2006/0133442 A1 | 6/2006 | Kondou et al. |
| 2006/0280668 A1 | 12/2006 | Dmitriev et al. |
| 2007/0014323 A1 | 1/2007 | Tachibana et al. |
| 2007/0138491 A1* | 6/2007 | Kawaguchi et al. ............ 257/94 |
| 2007/0177646 A1 | 8/2007 | Sogabe et al. |
| 2007/0200493 A1 | 8/2007 | Hsu et al. |
| 2007/0205410 A1 | 9/2007 | Ikeda et al. |
| 2007/0205424 A1* | 9/2007 | Kamikawa et al. ............. 257/94 |
| 2007/0210324 A1* | 9/2007 | Kawaguchi et al. ............ 257/96 |
| 2007/0246720 A1 | 10/2007 | Kamikawa et al. |
| 2007/0290378 A1 | 12/2007 | Coffin et al. |

FOREIGN PATENT DOCUMENTS

| | | |
|---|---|---|
| JP | 03-209895 | 9/1991 |
| JP | 09-162496 | 6/1997 |
| JP | 09-194204 | 7/1997 |
| JP | 09-283843 | 10/1997 |
| JP | 2743106 | 2/1998 |
| JP | 11-284271 | 10/1999 |
| JP | 2002-100830 | 4/2002 |
| JP | 2002-237648 | 8/2002 |
| JP | 2002-335053 | 11/2002 |
| JP | 2003-027215 | 1/2003 |
| JP | 2004-281686 | 10/2004 |
| JP | 2005-025910 | 1/2005 |
| JP | 2005-175111 A | 6/2005 |
| JP | 2005-340625 | 12/2005 |

OTHER PUBLICATIONS

Office Action for co-pending U.S. Appl. No. 11/638,581 dated Apr. 9, 2008.
Office Action for U.S. Appl. No. 11/785,981 dated Jun. 26, 2008.
Advisory Action for U.S. Appl. No. 11/638,581 dated Jul. 10, 2008.
Office Action for related U.S. Appl. No. 11/785,981 dated Dec. 30, 2008.
Office Action for related U.S. Appl. No. 11/713,761 dated Sep. 4, 2008.
Advisory Action for related U.S. Appl. No. 11/713,761 dated Dec. 30, 2008.
Office Action for related U.S. Appl. No. 11/638,581 dated Oct. 21, 2008.
Office Action for related U.S. Appl. No. 11/713,761 dated Apr. 6, 2009.
Office Action for related U.S. Appl. No. 11/638,581 dated Mar. 23, 2009.
Office Action for related U.S. Appl. No. 12/010,028 dated Mar. 20, 2009.
Office Action dated Jun. 4, 2009 from copending U.S. Appl. No. 11/785,981.
Advisory Action dated Aug. 3, 2009 in connection with U.S. Appl. No. 11/638,581.
U.S. Office Action dated Sep. 22, 2009 from copending U.S. Appl. No. 11/713,761.
U.S. Office Action dated Sep. 25, 2009 from copending U.S. Appl. No. 11/713,760.
U.S. Office Action dated Oct. 15, 2009 from copending U.S. Appl. No. 12/314,402.
U.S. Office Action dated Oct. 15, 2009 from copending U.S. Appl. No. 11/638,581.
Office Action dated Dec. 14, 2009 from copending U.S. Appl. No. 11/785,981.
Office Action dated Jan. 25, 2010 from copending U.S. Appl. No. 12/153,756.
Advisory Action dated Jan. 12, 2010 from copending U.S. Appl. No. 11/713,761.
Office Action dated Dec. 16, 2009 from copending U.S. Appl. No. 12/153,314.
Office Action dated Feb. 26, 2010 from copending U.S. Appl. No. 11/638,581.
Office Action mailed Oct. 13, 2010 from copending U.S. Appl. No. 12/153,756.
Office Action mailed Nov. 24, 2010 from co-pending U.S. Appl. No. 12/153,314.
Office Action mailed Nov. 24, 2010 from co-pending U.S. Appl. No. 12/213,686.
Office Action mailed Dec. 6, 2010 from co-pending U.S. Appl. No. 12/314,402.
US Office Action mailed Apr. 22, 2011 issued in co-pending U.S. Appl. No. 12/382,530.
US Office Action mailed Apr. 26, 2011 issued in co-pending U.S. Appl. No. 11/638,581.
US Office Action mailed May 2, 2011 issued in co-pending U.S. Appl. No. 12/805,644.
Office Action mailed Oct. 7, 2010 from copending U.S. Appl. No. 12/805,644.
Office Action mailed Oct. 4, 2010 from copending U.S. Appl. No. 11/638,581.
Office Action mailed Oct. 7, 2610 from copending U.S. Appl. No. 12/382,530.
Office Action mailed Oct. 28, 2010 from copending U.S. Appl. No. 11/713,761.
Advisory Action mailed Feb. 18, 2011 from co-pending U.S. Appl. No. 12/153,314.
US Office Action Mailed Jun. 8, 2011 issued in co-pending U.S. Appl. No. 12/232,525.
US Office Action mailed Aug. 23, 2011 issued in co-pending U.S. Appl. No. 12/153,314.
Office Action dated Jun. 17, 2010 from copending U.S. Appl. No. 12/153,756.
Office Action mailed Mar. 18, 2011 in co-pending U.S. Appl. No. 12/153,756.
Office Action mailed Mar. 21, 2011 in co-pending U.S. Appl. No. 12/213,686.
Office Action mailed Jun. 23, 2011 in co-pending U.S. Appl. No. 12/314,402.
US Office Action mailed Jul. 20, 2011 issued in co-pending U.S. Appl. No. 12/153,756.
US Office Action mailed Sep. 2, 2011 issued in co-pending U.S. Appl. No. 11/785,981.
Office Action dated Mar. 16, 2010 from copending U.S. Appl. No. 11/713,761.
Advisory Action dated Mar. 23, 2010 from copending U.S. Appl. No. 11/785,981.
Office Action dated May 24, 2010 from copending U.S. Appl. No. 11/638,581.
Office Action dated May 26, 2010 from copending U.S. Appl. No. 12/314,402.
Office Action dated May 26, 2010 from copending U.S. Appl. No. 12/382,530.
Office Action dated Jun. 9, 2010 from copending U.S. Appl. No. 12/153,314.
Hartnett, et al., "*Optical properties of ALON (aluminum oxynitride)*", Infrared Physics & Technology, vol. 39, pp. 203-211 (1998).

Dreer, et al., "*Statistical evaluation of refractive index, growth rate, hardness and Young's modulus of aluminium oxynitride films*", Thin Solid Films, vol. 354, pp. 43-49 (1999).

US Advisory Action mailed Jan. 30, 2012 issued in co-pending U.S. Appl. No. 11/638,581.

US Advisory Action mailed Jan. 26, 2012 issued in co-pending U.S. Appl. No. 12/232,525.

US Office Action mailed Feb. 16, 2012 issued in co-pending U.S. Appl. No. 12/805,644.

US Office Action mailed Feb. 28, 2012 issued in co-pending U.S. Appl. No. 12/314,402.

US Office Action mailed Oct. 12, 2011 issued in co-pending U.S. Appl. No. 12/805,644.

US Office Action mailed Nov. 9, 2011 issued in co-pending U.S. Appl. No. 12/314,402.

US Office Action mailed Nov. 15, 2011 issued in co-pending U.S. Appl. No. 12/153,756.

US Office Action mailed Feb. 15, 2012 issued in co-pending U.S. Appl. No. 12/153,314.

US Office Action mailed Oct. 7, 2011 issued in co-pending U.S. Appl. No. 12/382,530.

US Office Action mailed Oct. 13, 2011 issued in co-pending U.S. Appl. No. 11/638,581.

US Office Action mailed Oct. 7, 2011 issued in co-pending U.S. Appl. No. 12/232,525.

US Office Action mailed Jan. 3, 2012 issued in co-pending U.S. Appl. No. 11/785,981.

US Advisory Action mailed Oct. 4, 2011 issued in co-pending U.S. Appl. No. 12/314,402.

U.S. Advisory Action mailed Jun. 4, 2012 issued in co-pending U.S. Appl. No. 12/805,644.

US Advisory Action mailed Jun. 1, 2012 issued in co-pending U.S. Appl. No. 12/153,314.

US Office Action mailed Apr. 27, 2012 issued in co-pending U.S. Appl. No. 13/200,357.

* cited by examiner

NITRIDE SEMICONDUCTOR LIGHT EMITTING DEVICE AND METHOD OF FABRICATING NITRIDE SEMICONDUCTOR LASER DEVICE

This nonprovisional application is based on Japanese Patent Application No. 2005-363590 filed with the Japan Patent Office on Dec. 16, 2005, the entire contents of which are hereby incorporated by reference.

BACKGROUND OF THE INVENTION

1. Field of the Invention

The present invention relates to nitride semiconductor light emitting devices and methods of fabricating nitride semiconductor laser devices.

2. Description of the Background Art

It is generally known that a semiconductor laser device having a cavity with a facet degraded is impaired in reliability. It is considered that a cavity has a facet degraded when a nonradiative recombination level exists and accordingly the facet excessively generates heat. A major cause of such level is that the cavity has a facet oxidized.

Accordingly Japanese Patent Laying-Open No. 09-162496 (Patent Document 1) discloses a method coating a facet of a cavity with a coating film formed of a nitride not excluding oxygen to prevent the cavity from having the facet oxidized. Furthermore, Japanese Patent Laying-Open No. 2002-237648 (Patent Document 2) discloses a method coating a facet of a cavity of a nitride semiconductor laser device with a coating film of dielectric material of the same nitride as the facet to reduce a nonradiative recombination level.

Thus coating a facet of a cavity with a coating film of nitride has conventionally been known. Among nitrides, aluminum nitride (AlN) is particularly chemically and thermally stable and is an insulator of good quality, and is also high thermal conductivity and significantly effectively dissipates heat. As such, it exhibits an excellent feature as a coating film coating a facet of a cavity of a semiconductor laser (see Japanese Patent Laying-Open No. 03-209895 (Patent Document 3) for example). A coating film which does not contain oxygen, however, is generally high in stress and considered to lead to degradation such as dark line for example.

SUMMARY OF THE INVENTION

The present inventors have studied to develop a technique to form a coating film of AlN aforementioned on a facet of a cavity to implement a nitride semiconductor laser device that can be driven for high output without impairing reliability as the cavity has the facet degraded.

Initially, ECR sputtering is performed with aluminum (Al) and gaseous nitrogen to deposit a coating film of AlN of 50 nm thick at 100° C. on a light emitting facet of a cavity of a nitride semiconductor laser device. Furthermore, the nitride semiconductor laser device is provided at a light reflecting facet of the cavity with a highly reflective film formed of a pair of silicon oxide film and titanium oxide film to obtain a high reflectance of at least 95%.

The nitride semiconductor laser device thus fabricated was examined for catastrophic optical damage (COD) level before and after it was aged (for 300 hours at 70° C. at 100 mW, CW driven). A COD level indicates a maximum optical output value of a device that is obtained when it receives a gradually increasing current and finally has a facet destroyed thereby and thus stops lasing. Note that in the present specification a COD level is evaluated by a maximum optical output value of a device that is obtained when the device's optical output-current characteristic is measured with the device CW driven. Herein a COD level was evaluated by an average value of the COD levels of five such nitride semiconductor laser devices.

Figure 11:
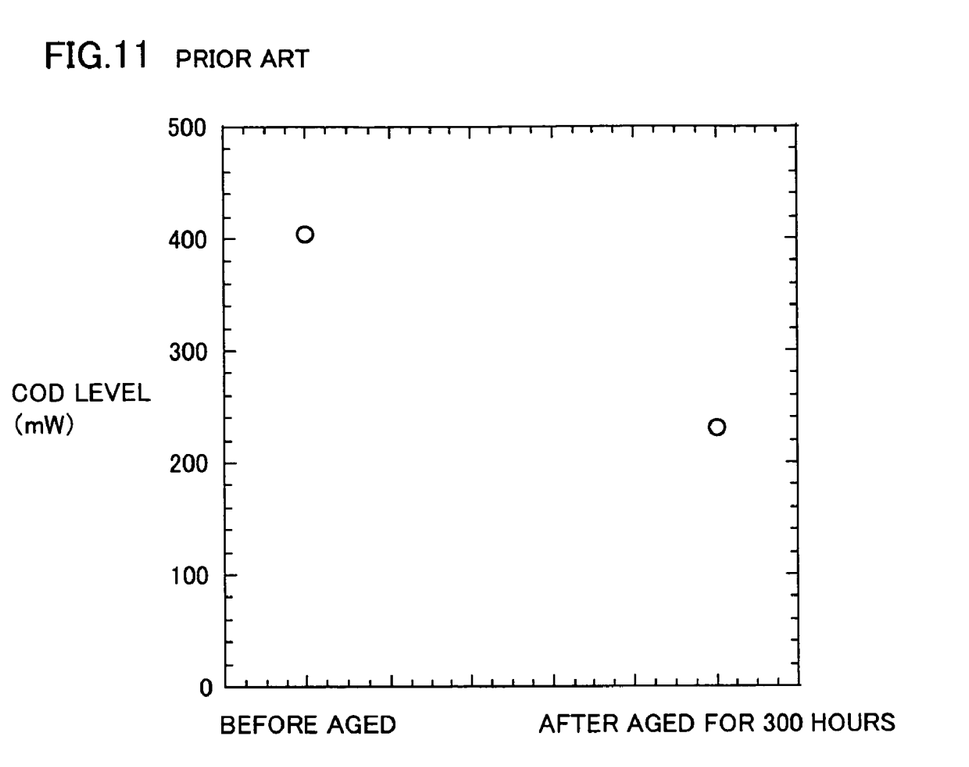
FIG. 11 compares a COD level of a conventional nitride semiconductor laser device that is obtained before it is aged and a COD level thereof that is obtained after it is aged.

As a result, before they were aged they thermally saturated at an optical output of 400 mW, and after they were aged their cavities thus have their facets destroyed with COD, and their COD level was approximately 230 mW, as shown in FIG. 11.

The aged devices provided a decreased COD level probably because a nitride semiconductor forming the light emitting facet of the cavity and AlN forming the coating film had their mutual contact impaired and thus at their interface there was generated an intense heat, which degraded the facet of the cavity. The impaired contact was caused probably by the internal stress that the coating film has, a difference between the facet of the cavity and the coating film in thermal expansion coefficient, and the heat generated when the device lases.

Furthermore, if a coating film formed of AlN is provided at a light extraction plane serving as a light emitting portion of a nitride semiconductor light emitting diode device, and the light extraction plane, formed of nitride semiconductor, and the coating film formed of AlN have their mutual contact impaired, a nonradiative center or the like formed at their interface can absorb light, resulting in inefficiency in extracting light.

Accordingly the present invention contemplates a nitride semiconductor light emitting device that can provide an improved COD level while it is aged, and a method of fabricating a nitride semiconductor laser device.

The present invention is a nitride semiconductor light emitting device having a light emitting portion coated with a coating film, wherein the light emitting portion is formed of a nitride semiconductor, and the coating film in contact with the light emitting portion is formed of an oxynitride.

Herein the present nitride semiconductor light emitting device may be a nitride semiconductor laser device and the light emitting portion may be a facet of a cavity.

Furthermore in the present nitride semiconductor light emitting device the oxynitride can be aluminum oxynitride or silicon oxynitride.

Furthermore in the present nitride semiconductor light emitting device the oxynitride preferably contains oxygen in an amount of at least 2 atomic % and at most 35 atomic %.

Furthermore in the present nitride semiconductor light emitting device the oxynitride more preferably contains oxygen in an amount of at least 2 atomic % and at most 15 atomic %.

Furthermore in the present nitride semiconductor light emitting device a film formed of an oxide or a nitride can be deposited on the coating film.

Furthermore in the present nitride semiconductor light emitting device the film formed of the nitride can be a film formed of a nitride of at least one of silicon and aluminum. Herein if the film formed of the nitride is a film formed of the nitride of silicon the film preferably has a thickness of at least 5 nm.

Furthermore in the present nitride semiconductor light emitting device the film formed of the oxide can be a film formed of at least one selected from the group consisting of aluminum oxide, silicon oxide, titanium oxide, hafinium oxide, zirconium oxide, niobium oxide, tantalum oxide, and yttrium oxide.

Furthermore in the present nitride semiconductor light emitting device on the coating film a film formed of an oxynitride can be deposited. Herein the film formed of the oxynitride can be a film formed of an oxynitride of silicon or aluminum.

Furthermore in the present nitride semiconductor light emitting device on the coating film a film formed of magnesium fluoride can be deposited.

Furthermore the present invention is a method of fabricating a nitride semiconductor laser device with a cavity having a facet coated with a coating film, comprising the steps of: providing cleavage to form the facet of the cavity; and coating the facet of the cavity with a coating film formed of an oxynitride.

Furthermore in the present method of fabricating the nitride semiconductor laser device the oxynitride can be provided by employing aluminum oxide as a target.

Furthermore in the present method of fabricating the nitride semiconductor laser device the oxynitride can be provided by employing aluminum oxynitride as a target.

The present invention can thus provide a nitride semiconductor light emitting device that can provide an improved COD level while it is aged, and a method of fabricating a nitride semiconductor laser device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter embodiments of the present invention will be described. Note that in the figures, identical reference characters denote identical or corresponding components.

The present invention is a nitride semiconductor light emitting device having a light emitting portion coated with a coating film. The light emitting portion is formed of nitride semiconductor and the coating film contacting the light emitting portion is formed of an oxynitride. Thus in the present invention the light emitting portion can be coated with a coating film formed of an oxynitride to allow the light emitting portion formed of the nitride semiconductor and the coating film formed of the oxynitride to contact each other more closely to allow the nitride semiconductor light emitting device to achieve an improved COD level while it is aged.

Herein the present nitride semiconductor light emitting device for example includes a nitride semiconductor laser device, a nitride semiconductor light emitting diode device, and the like. Furthermore, if the present nitride semiconductor light emitting device is a nitride semiconductor laser device, its light emitting portion corresponds to a facet of a cavity. If the present nitride semiconductor light emitting device is the nitride semiconductor light emitting diode device, then its light emitting portion corresponds to a light extraction plane. Note that in the present invention the nitride semiconductor laser device indicates a semiconductor laser device at least having an active layer and a clad layer formed of material containing $Al_xIn_yGa_zN$ (a compound of at least one group-III element selected from the group consisting of aluminum, indium and gallium, and nitrogen, a group-V element) as a main component, wherein $0 \leq x \leq 1$, $0 \leq y \leq 1$, $0 \leq z \leq 1$, and $x+y+z \neq 0$. Furthermore in the present invention a facet of a cavity means a mirror plane formed at least by cleaving a stack including an active layer and a clad layer stacked on the substrate.

Furthermore, the oxynitride employed in the prevent invention can be implemented for example by aluminum oxynitride or silicon oxynitride. Herein the oxynitride preferably contains oxygen as a constituent in an amount of at least 2 atomic % and at most 35 atomic %. If the oxynitride contains oxygen in an amount of less than 2 atomic %, it provides a tendency that the light emitting portion formed of the nitride semiconductor and the coating film formed of the oxynitride contact each other less closely and heat is generated and thus impairs the light emitting portion. If the oxynitride contains oxygen in an amount of more than 35 atomic %, the oxygen contained in the coating film oxidizes the light emitting portion formed of the nitride semiconductor and a nonradiative recombination level is caused, and a tendency to provide a reduced COD level is provided. More preferably the oxynitride contains oxygen as a constituent in an amount of at least 2 atomic % and at most 15 atomic %.

Furthermore the coating film formed of the oxynitride employed in the present invention preferably has a thickness of at least 1 nm. If the coating film has a thickness of less than 1 nm it is hardly controllable in thickness and may fails to completely coat the light emitting portion. In contrast, if the coating film is excessively large in thickness, there is a possibility that stress becomes an issue to be considered. However, the present invention's effect would not be impaired because the coating film is excessively large in thickness.

Furthermore, the coating film formed of the oxynitride employed in the prevent invention may underlie a film formed of an oxide (e.g., at least one type of oxide selected from the group consisting of aluminum oxide, silicon oxide, titanium oxide, hafnium oxide, zirconium oxide, niobium oxide, tantalum oxide, and yttrium oxide), a nitride (e.g., at least one nitride of aluminum nitride and silicon nitride) and the like to control reflectance. Furthermore in the present invention on the coating film formed of the oxynitride there may be deposited a film formed of magnesium fluoride (MgF) or a similar fluoride or a film formed of silicon oxynitride, aluminum oxynitride or the like as a film formed of an oxynitride different in composition in oxygen from the oxynitride forming the underlying coating film.

For example, as shown Table 1, a variety of types layers may be combined together to control reflectance. Note that while Table 1 shows that a first layer adjacent to a surface of the nitride semiconductor to serve as a coating film is formed of aluminum oxynitride, it may alternatively be formed of silicon oxynitride.

TABLE 1

| 1st layer adjacent to nitride semiconductor | | 2nd layer overlying 1st layer | | 3rd layer overlying 2nd layer | |
|---|---|---|---|---|---|
| material | thickness | material | thickness | material | thickness |
| aluminum oxynitride (oxygen content: 2%) | 20 nm | aluminum oxide ($Al_2O_3$) | 140 nm | — | — |
| aluminum oxynitride (oxygen content: 5%) | 10 nm | aluminum oxynitride (oxygen content: 10%) | 5 nm | aluminum oxide ($Al_2O_3$) | 140 nm |
| aluminum oxynitride (oxygen content: 11%) | 50 nm | silicon oxide ($SiO_2$) | 120 nm | — | — |
| aluminum oxynitride (oxygen content: 15%) | 6 nm | titanium oxide ($TiO_2$) | 50 nm | — | — |
| aluminum oxynitride (oxygen content: 5%) | 10 nm | tantalum oxide ($Ta_2O_5$) | 100 nm | — | — |
| aluminum oxynitride (oxygen content: 5%) | 10 nm | yttrium oxide ($Y_2O_5$) | 230 nm | — | — |
| aluminum oxynitride (oxygen content: 5%) | 80 nm | zirconium oxide ($ZrO_2$) | 100 nm | — | — |
| aluminum oxynitride (oxygen content: 2%) | 20 nm | silicon nitride ($Si_3N_4$) | 20 nm | silicon oxide ($SiO_2$) | 140 nm |
| aluminum oxynitride (oxygen content: 4%) | 20 nm | silicon nitride ($Si_3N_4$) | 20 nm | aluminum oxide ($Al_2O_3$) | 120 nm |
| aluminum oxynitride (oxygen content: 3%) | 25 nm | silicon nitride ($Si_3N_4$) | 150 nm | — | — |
| aluminum oxynitride (oxygen content: 4%) | 20 nm | silicon nitride ($Si_3N_4$) | 150 nm | aluminum oxide ($Al_2O_3$) | 120 nm |
| aluminum oxynitride (oxygen content: 7%) | 20 nm | silicon oxynitride (oxygen content: 5%) | 150 nm | — | — |
| aluminum oxynitride (oxygen content: 7%) | 20 nm | silicon nitride ($Si_3N_4$) | 20 nm | silicon oxynitride (oxygen content: 5%) | 150 nm |

Furthermore, if the present nitride semiconductor light emitting device is a nitride semiconductor laser device, then the present nitride semiconductor laser device can be fabricated by a method including the steps of: forming a facet of a cavity by cleavage; and coating the facet of the cavity with a coating film formed of an oxynitride.

Herein if the coating film is formed of aluminum oxynitride then the coating film can be formed for example by providing a target of aluminum oxide in a film deposition chamber, introducing only gaseous nitrogen into the film deposition chamber, and performing reactive sputtering. Thus employing the target of aluminum oxide can eliminate the necessity of intentionally introducing gaseous oxygen into the film deposition chamber in depositing the oxynitride.

Furthermore, if a reactive sputtering apparatus is employed, the target formed of aluminum oxide can be dispensed with: instead, a target formed of aluminum can be placed in the film deposition chamber and gaseous oxygen can subsequently be introduced thereinto, and a microwave can be applied to generate a plasma of oxygen to oxidize a surface of the target of aluminum to prepare on the surface a target formed of aluminum oxide.

For example, the aluminum oxynitride can be produced from a target of aluminum through such steps as follows:

Step 1: A target of aluminum is placed in the film deposition chamber of the reactive sputtering apparatus and gaseous oxygen is introduced into the chamber. A microwave is applied to expose the target of aluminum to a plasma of oxygen to oxidize the target of aluminum from a surface by approximately several nm to prepare a target formed of aluminum oxide; and Step 2: Subsequently, gaseous nitrogen and gaseous argon are introduced in the film deposition chamber and a microwave is applied to cause a plasma thereof and in that condition the target of aluminum oxide is sputtered to form the aluminum oxynitride.

Between steps 1 and 2 there may be introduced the step of exposing a surface of the nitride semiconductor to a plasma of argon, a plasma of nitrogen, or a plasma of a gaseous mixture of argon and nitrogen to clean the surface of the nitride semiconductor.

Furthermore, if the coating film is formed of aluminum oxynitride, aluminum is prone to oxidation, and if gaseous oxygen is introduced into the film deposition chamber, there is a tendency that it is difficult to exert control to provide an oxynitride controlled in composition to have a small content of oxygen, and to reproduce such oxynitride. However, this can be addressed by using as a target of an aluminum oxide represented by $Al_xO_y$, and less oxidized, and avoiding introducing gaseous oxygen into the film deposition chamber and instead introducing gaseous nitrogen alone thereinto so that an aluminum oxynitride having a small content of oxygen can be relatively readily deposited, wherein $0<x<1$, $0<y<0.6$, and $x+y=1$. Furthermore, replacing the target of the aluminum oxide represented by $Al_xO_y$ and less oxidized with a target of an aluminum oxynitride having a small content of oxygen can be similarly effective, wherein $0<x<1$, $0<y<0.6$, and $x+y=1$.

Furthermore, modifying a degree of vacuum in the film deposition chamber and/or modifying temperature and/or the like condition(s) therein for film deposition can also provide an oxynitride variable in content of oxygen and hence composition. Note that when the film deposition chamber has lower degrees of vacuum it tends to help the oxynitride to introduce oxygen, and that higher temperatures for film deposition tend to prevent the oxynitride from introducing oxygen thereinto.

Furthermore, if the film deposition chamber has an internal wall oxidized or is provided at the internal wall with aluminum oxide, and thereafter gaseous argon and gaseous nitrogen are introduced into the film deposition chamber, and a target of Al is employed and sputtering is thus performed to deposit a film, then the internal wall has oxygen departed by a plasma, and a coating film formed of aluminum oxynitride can thus be formed.

Furthermore while in the above a nitride semiconductor laser device having a ridged stripe has been exemplified, the gist of the present invention relates to a film coating a light extraction plane allowing light generated in nitride semiconductor to be extracted from the nitride semiconductor externally. As such, the present invention is not limited to the nitride semiconductor laser device having the ridged stripe. It is also effectively applicable for example to a film coating a light extraction plane of a surface emitting laser, a film coating a light extraction plane of a nitride semiconductor light emitting diode (i.e., a surface of nitride semiconductor, or a side surface cleaved or divided in dividing into chips), and the like.

First Embodiment

Figure 1:
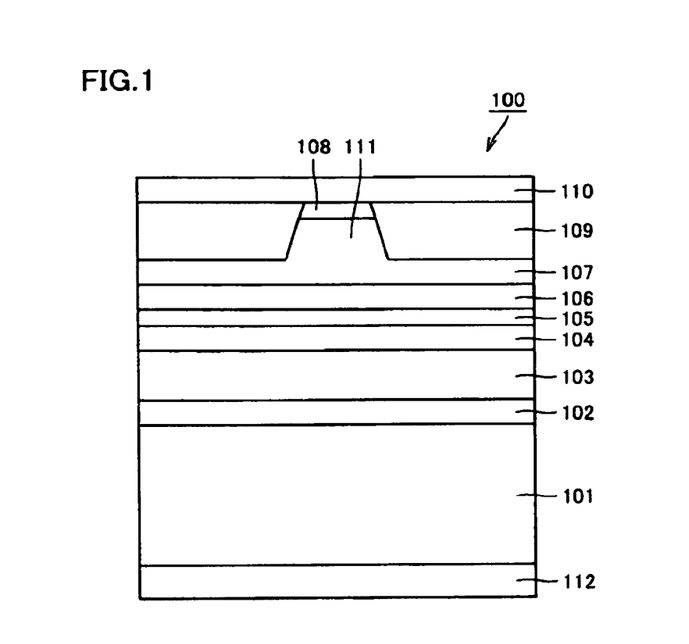
FIG. 1 is a schematic cross section of one preferred example of the present nitride semiconductor laser device in a first embodiment.

FIG. 1 is a schematic cross section of one preferred example of a nitride semiconductor laser device of the present embodiment. More specifically, the present embodiment provides a nitride semiconductor laser device 100 including an n type GaN substrate 101, an n type AlGaInN buffer layer 102 deposited thereon, an n type AlGaInN clad layer 103 deposited thereon, an n type AlGaInN guide layer 104 deposited thereon, an AlGaInN multi quantum well active layer 105 deposited thereon, a p type AlGaInN guide layer 106 deposited thereon, a p type AlGaInN clad layer 107 deposited thereon, and a p type AlGaInN contact layer 108 deposited thereon. It should be noted that each layer has a composition ratio adjusted as appropriate and thus irrelevant to the essence of the present invention. Furthermore in the present embodiment the nitride semiconductor laser device lases at a wavelength which can be adjusted, as appropriate, within a range for example of 370 nm to 470 nm depending on the composition ratio of AlGaInN multi quantum well active layer 105. The present embodiment is adjusted to allow lasing at a wavelength of 405 nm.

Note that while the present embodiment employs a substrate formed of GaN, the present invention may be implemented with a substrate formed for example of AlGaN or AlN.

Furthermore in the present embodiment nitride semiconductor laser device 100. has p type AlGaInN clad layer 107 and p type AlGaInN contact layer 108 partially removed to have ridged stripe portion 111 extending in the direction of the length of a cavity. Herein ridged stripe portion 111 has a width for example of approximately 1.2 μm to 2.4 μm, typically approximately 1.5 μm. Note that while the present specification describes that ridged stripe portion 111 has a width of approximately 1.2 μm to 2.4 μm by way of example the present invention is also suitably applicable to a broad-area nitride semiconductor laser device used for example in applications for illumination. (The "broad area" means that ridged stripe portion 111 has a width of approximately 2 μm to 100 μm.)

Furthermore, p type AlGaInN contact layer 108 has a surface provided with a p electrode 110 and under p electrode 110 an insulation film 109 is provided except for a portion provided with ridged stripe portion 111. Furthermore on n type GaN substrate 101 at a surface opposite that having the aforementioned layers stacked thereon an n electrode 112 is deposited.

Figure 2:
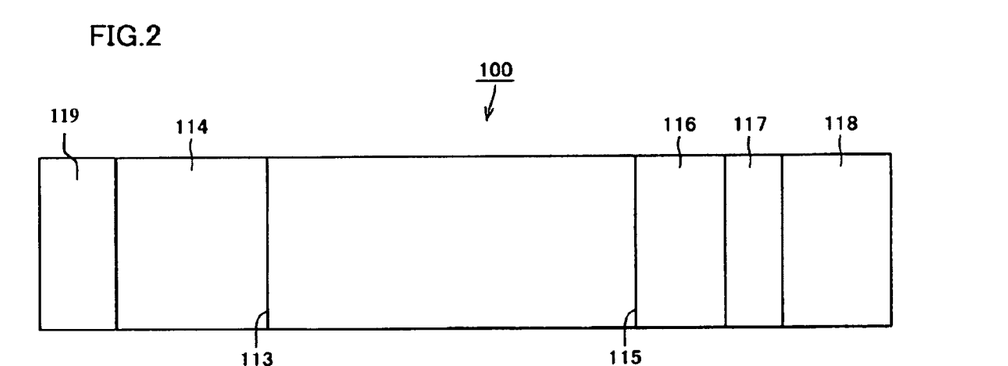
FIG. 2 is a schematic side view of the present nitride semiconductor laser device of the first embodiment shown in FIG. 1, as seen along the length of its cavity.

FIG. 2 is a schematic side view of the nitride semiconductor laser device of the present embodiment shown in FIG. 1, as seen in the direction of the length of the cavity. Herein in the present embodiment nitride semiconductor laser device 100 has the cavity with a light emitting facet 113, which serves as a light emitting portion of laser device 100, coated with a coating film 114 formed of aluminum oxynitride and having a thickness of 50 nm, and a light reflecting facet 115 provided with a 6 nm thick aluminum oxynitride film 116, a 80 nm thick aluminum oxide film 117, a 71 nm thick silicon oxide film and a 46 nm thick titanium oxide film paired and deposited by four pairs in layers, with the silicon oxide film first deposited, and thereafter a 142 nm thick, frontmost silicon oxide film deposited to provide a highly reflective film 118.

Note that coating film 114, and aluminum oxynitride film 116, aluminum oxide film 117 and highly reflective film 118 are deposited on facets 113 and 115, respectively, of a cavity of a sample prepared that are exposed as a cleavage plane provided by cleaving a wafer having deposited on the n type GaN substrate the n type AlGaInN buffer layer and other aforementioned semiconductor layers in order in layers, and provided with a ridged stripe portion, followed by an insulation film and p and n electrodes.

It should be noted that preferably before coating film 114 is deposited, in the film deposition apparatus the cavity has facet 113 heated for example at at least 100° C. and at most 500° C. to remove oxide film, impurity and the like from facet 113 to clean it, although the present invention may dispense with doing so. Furthermore the cavity may have facet 113 exposed to a plasma for example of argon or nitrogen and thus. cleaned, although the present invention may dispense with doing so. Furthermore the cavity may also have facet 113 heated and simultaneously exposed to a plasma. Furthermore when the facet is exposed to the plasma, for example it may be exposed to a plasma of argon, followed by that of nitrogen, or vice versa. Other than argon and nitrogen, for example a rare gas for example of helium, neon, xenon, krypton or the like can also be used. Furthermore, while preferably the cavity is provided at facet 113 with coating film 114 deposited with the facet heated at at least 100° C. and at most 500° C., the present invention may dispense with thus heating the facet in depositing coating film 114.

While coating film 114 can for example be sputtered through electron cyclotron resonance (ECR) as described hereinafter, the film can also be formed by a variety of other sputtering techniques, chemical vapor deposition (CVD), electron beam deposition (EB) or the like. Furthermore, the coating film formed of the oxynitride employed in the prevent invention may underlie a film 119 formed of an oxide (e.g., at least one type of oxide selected from the group consisting of aluminum oxide, silicon oxide, titanium oxide, hafnium oxide, zirconium oxide, niobium oxide, tantalum oxide, and yttrium oxide), a nitride (e.g., at least one nitride of aluminum nitride and silicon nitride) and the like to control reflectance. Furthermore in the present invention on the coating film formed of the oxynitride there may be deposited a film 119 formed of magnesium fluoride (MgF) or a similar fluoride or a film 119 formed of silicon oxynitride, aluminum oxynitride or the like as a film 119 formed of an oxynitride different in composition in oxygen from the oxynitride forming the underlying coating film.

Figure 3:
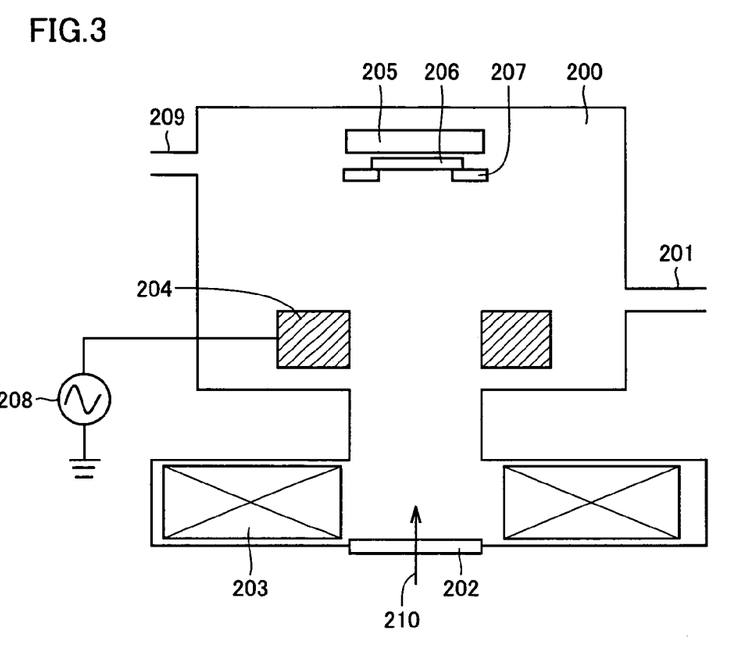
FIG. 3 schematically shows a configuration of an ECR sputtering deposition apparatus.

FIG. 3 schematically shows an ECR sputtering deposition apparatus in structure. More specifically, the ECR sputtering deposition apparatus includes a film deposition chamber 200, a magnetic coil 203, and a microwave introduction window 202. Film deposition chamber 200 has a gas inlet 201 and a gas outlet 209 and is internally provided with a target 204 of Al connected to an RF power supply 208, and a heater 205. Furthermore film deposition chamber 200 is also internally provided with a sample stage 207 and thereon a sample 206 as described above is set. Magnetic coil 203 is provided to generate a magnetic field required to generate a plasma and RF power supply 208 is used to sputter target 204 of Al. Through microwave introduction window 202 a microwave 210 is introduced into film deposition chamber 200.

Then gaseous nitrogen is introduced through gas inlet 201 into film deposition chamber 200 at a flow rate of 5.5 sccm and gaseous oxygen is introduced thereinto at a flow rate of 1.0 sccm, and furthermore, gaseous argon is introduced thereinto at a flow rate of 20.0 sccm to efficiently generate a plasma to deposit a film faster. Note that the gaseous nitrogen and oxygen introduced into film deposition chamber 200 can be varied in ratio to allow coating film 114 to contain oxygen in a varied amount. Furthermore, in order to sputter target 204 made of Al, an RF power of 500 W is applied to target 204 of Al and a microwave power of 500 W required to generate a plasma is applied. As a result, at a film deposition rate of 1.7 Å/sec, coating film 114 formed of an aluminum oxynitride providing an index of refraction of 2.0 for light having a wavelength of 633 nm can be deposited. Coating film 114 is formed of aluminum, nitrogen and oxygen, and their respective contents (atomic %) can be measured for example by Auger electron spectroscopy (AES). Furthermore, the content of the oxygen forming coating film 114 can also be measured by transmission electron microscopy-energy dispersive x-ray spectroscopy (TEM-EDX).

Figure 4:
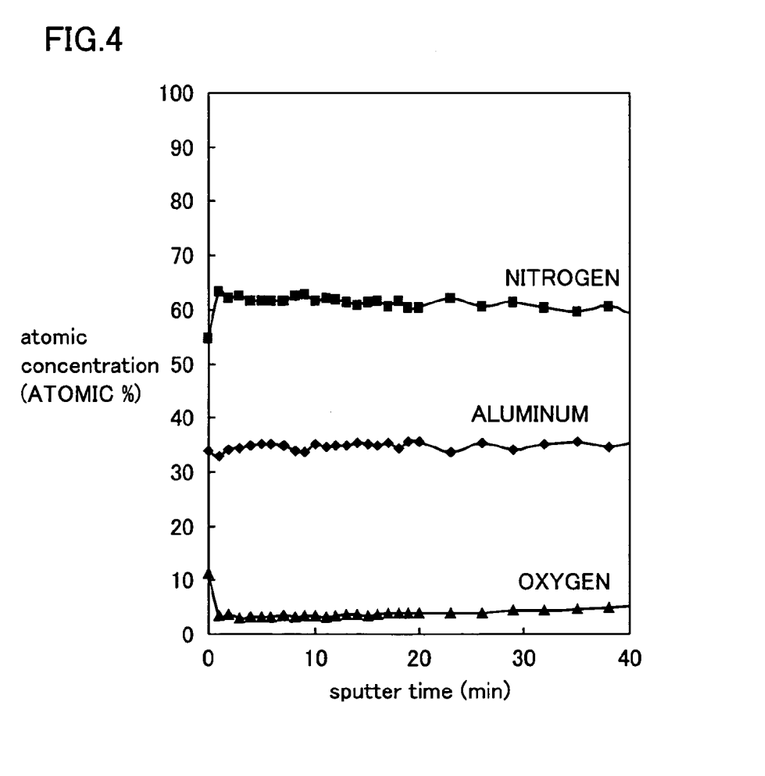
FIG. 4 represents a result of an analysis in composition, as seen depthwise, by AES of an aluminum oxynitride film separately prepared under a condition identical to that adopted in the first embodiment of the present invention.

FIG. 4 shows a result of a depthwise AES composition analysis of an aluminum oxynitride separately provided under a condition identical to that described above. The contents of aluminum, oxygen and nitrogen, respectively, were obtained as based on an AES signal in intensity, with the sensitivity of a peak of each element considered. Herein, the aluminum, the oxide and the nitrogen together assume 100 atomic % and an element other than the aluminum, oxygen and nitrogen and contained in a small amount, such as argon, is excluded therefrom.

As shown in FIG. 4, the aluminum oxynitride contains aluminum in an amount of 34.8 atomic %, oxygen in an amount of 3.8 atomic %, and nitrogen in an amount of 61.4 atomic % and has a substantially uniform composition as seen depthwise. It should be noted that, although not shown in FIG. 4, a negligible amount of argon was detected.

Furthermore, the light reflecting facet 115 of the cavity may also have aluminum oxynitride film 116, aluminum oxide film 117, and highly reflective film 118 deposited for example by ECR sputtering, similarly as done when coating film 114 is deposited. Preferably before these films are also deposited the facet is heated and thus cleaned and/or exposed to a plasma and thus cleaned. It should be noted, however, that having a light emitting facet degraded would be considered as a more serious concern, since the light emitting facet has large optical density, and it is often the case that having a light reflecting facet degraded would not be a concern, since the light reflecting facet has smaller optical density than the light emitting facet. Accordingly the present invention only requires that the cavity have the light emitting facet coated with a coating film formed of oxynitride, and the cavity may have the light reflecting facet without aluminum oxynitride film or the like covering it. Furthermore while in the present embodiment the cavity has the light reflecting facet 115 provided with aluminum oxynitride 116 having a thickness of 6 nm, it can without a problem in particular be replaced with aluminum oxynitride 116 having as large a thickness for example as 50 nm.

Furthermore the cavity having a facet coated with the aforementioned film may subsequently be heated. This can be expected to remove moisture contained in the aforementioned film and improve the film in quality.

Thus the aforementioned sample is provided at the cavity on the light emitting facet 113 with coating film 114, and on the light reflecting facet 115 with aluminum oxynitride film 116, then aluminum oxide film 117 and then highly reflected film 118, and thereafter divided into chips to obtain the nitride semiconductor laser device of the present embodiment.

Figure 5:
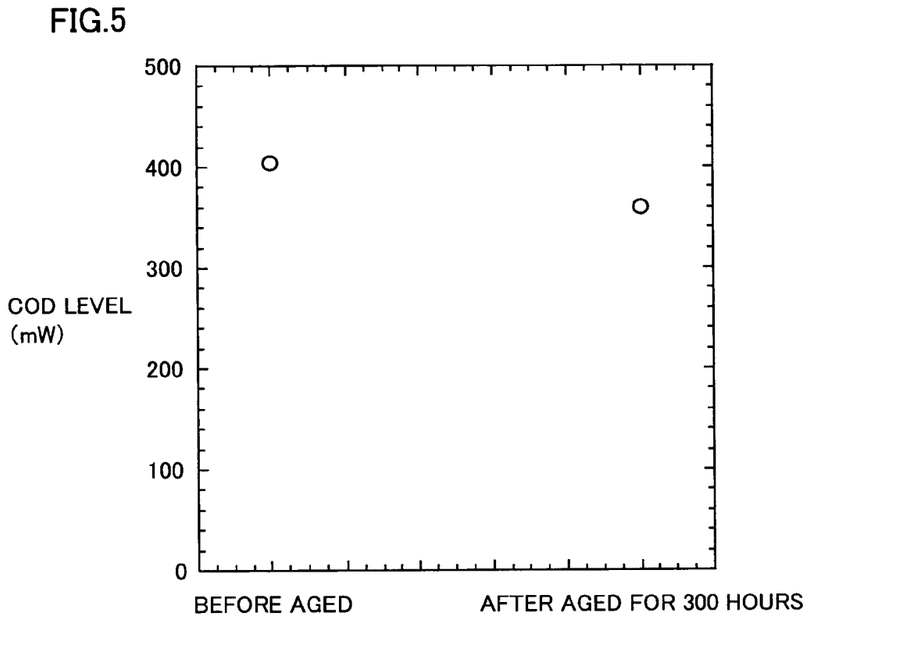
FIG. 5 shows a result of examining a COD level of the present nitride semiconductor laser device in the first embodiment before and after it is aged.

The nitride semiconductor laser device of the present embodiment was examined for COD level before and after it was aged (for 300 hours at 70° C. at 100 mW, CW driven). A result thereof is shown in FIG. 5. As shown in FIG. 5, before it was aged it had a COD level of approximately 400 mW and after it was aged it had a COD level of approximately 350 mW. It has been found to provide a hardly degraded COD level.

Figure 6:
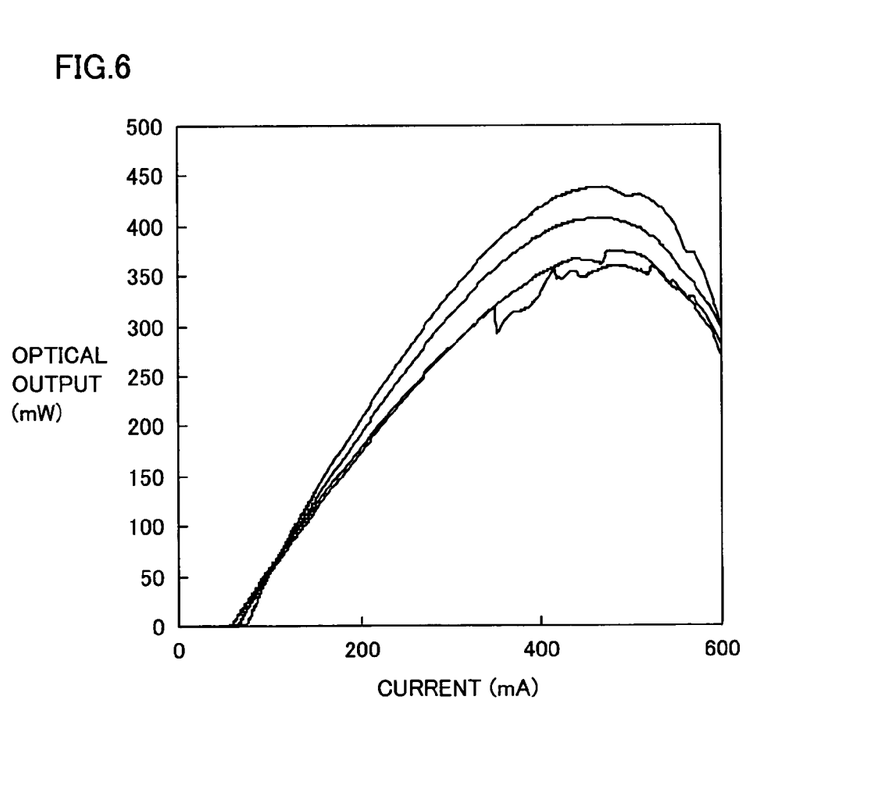
FIG. 6 is a graph representing an optical output-current characteristics of the present nitride semiconductor laser device in the first embodiment after it is aged.

Furthermore FIG. 6 shows a graph of an optical output-current characteristic of the nitride semiconductor laser device of the present embodiment after it is aged; As shown in FIG. 6, after the nitride semiconductor laser device of the present embodiment was aged for 300 hours it still thermally saturated and the cavity was not observed to have light emitting facet 113 destroyed. The nitride semiconductor laser device of the present embodiment before it was aged of course also thermally saturated at an optical output of 400 mW, and the cavity was not observed to have light emitting facet 113 destroyed.

Figure 7:
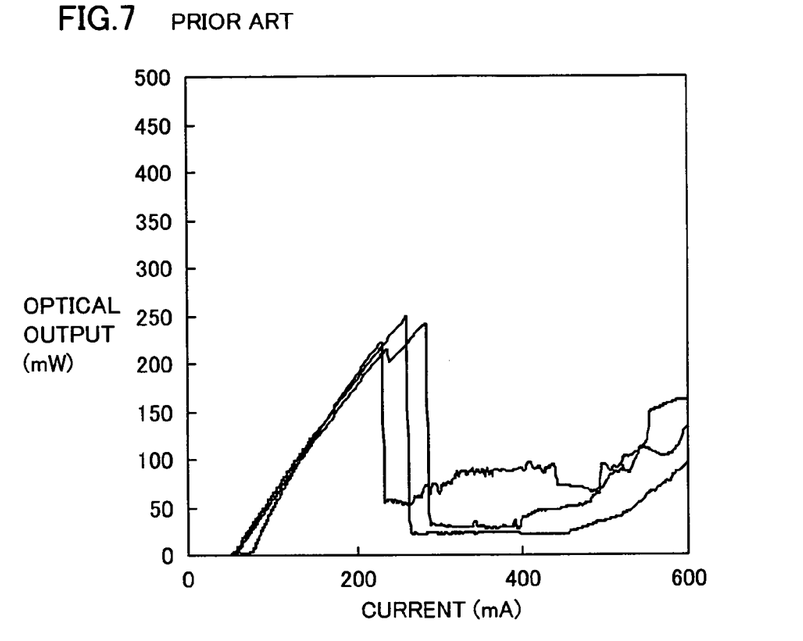
FIG. 7 is a graph representing an optical output-current characteristics of a conventional nitride semiconductor laser device after it is aged.

In contrast FIG. 7 shows a graph of an optical output-current characteristic of a conventional nitride semiconductor laser device with a cavity having a light emitting facet provided with a coating film of AlN, as observed after it is aged for 300 hours at 70° C. at 100 mW, CW driven. As shown in FIG. 7, when the conventional nitride semiconductor laser device provided an optical output of approximately 250 mW, the cavity had the facet destroyed by COD. The above result thus reveals that the nitride semiconductor laser device of the present embodiment with a cavity having a light emitting facet provided with a coating film of aluminum oxynitride is compared with the conventional nitride semiconductor laser device with a cavity having a light emitting facet provided with a coating film of AlN, as observed after they are aged, the former provides an improved COD level.

A nitride semiconductor laser device with a cavity having a light emitting facet provided a coating film formed of oxynitride is not observed to provide a reduced COD level after it is aged probably because the facet of the cavity and the coating film can contact each other more closely. Nitride semiconductor contacts a coating film formed of oxynitride more closely than a coating film formed of AlN or a similar nitride probably because a strong bonding energy of aluminum, gallium or a similar group m element and oxygen acts. More specifically the oxynitride contains oxygen, which is considered to have a strong bond with aluminum, gallium or a similar group III element contained in the nitride semiconductor and thus contribute to enhanced contact. It can be said that the oxygen serves as a kind of adhesive. In other words this would be considered a technique that allows the nitride semiconductor and the coating film formed of the oxynitride to contact more closely.

Figure 8:
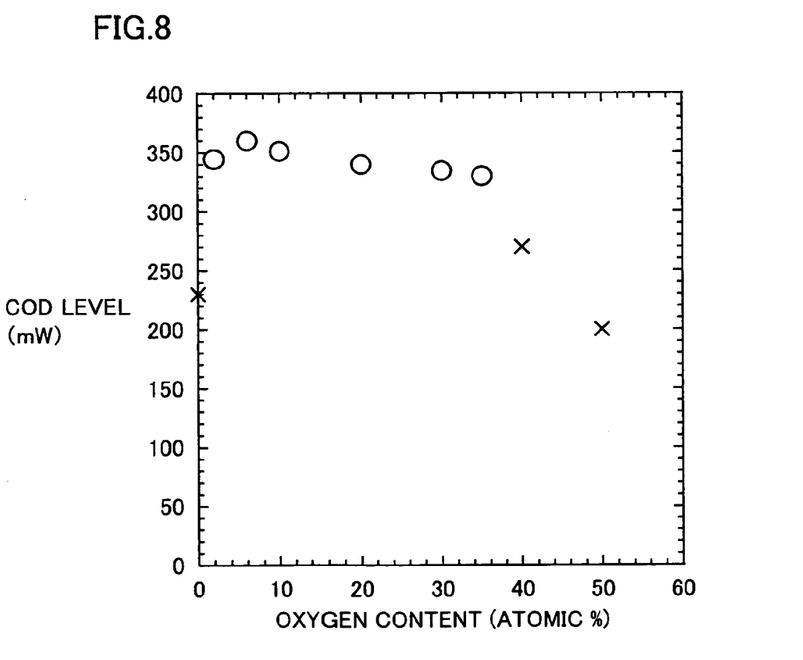
FIG. 8 shows a result of examining a COD level dependency of a content of oxygen of a coating film formed of aluminum oxynitride in the present nitride semiconductor laser device of the first embodiment.

The COD level dependency of a content of oxygen in the coating film of the aluminum oxynitride in the nitride semiconductor laser device of the present embodiment, was examined. A result thereof is shown in FIG. 8. More specifically, the nitride semiconductor laser device of the present embodiment having the coating film of the aluminum oxynitride with oxygen contained therein in an mount variable from 0 atomic % to 50 atomic % was aged for 300 hours (at 70° C. at 100 mW, CW driven) and its COD level was measured. Basically, oxygen and nitrogen both bond to aluminum. As such, while the coating film contains oxygen in a variable amount, the coating film contains aluminum in a substantially invariable amount (in atomic %), and nitrogen will accordingly be contained in an amount (in atomic %) decreased by that (in atomic %) of oxygen contained that is increased.

Furthermore in FIG. 8 a circle indicates a position of a peak of an optical output in a optical output-current characteristic provided when the nitride semiconductor laser device does not have COD and thermally saturates, and its COD level will be higher than the indicated value, and a cross indicates that the nitride semiconductor laser device has COD, and the indicated value will be its COD level.

As shown in FIG. 8, it can be seen that if the laser device has a coating film formed of aluminum oxynitride containing oxygen in an amount of at least 2 atomic % and at most 35 atomic %, the laser device thermally saturates at an optical output of 300 mW or larger and it can be seen that the laser device exhibits an excellent characteristic. Accordingly the cavity preferably has the light emitting facet coated with a coating film containing oxygen in an amount of at least 2 atomic % and at most 35 atomic %. This provides a tendency that the laser device provides an improved COD level while it is aged. This is probably because the cavity's facet formed of the nitride semiconductor and the coating film formed of the aluminum oxynitride contact each other more closely and the cavity thus does not have the facet so oxidized as to cause a nonradiative recombination level and accordingly affect the device's COD level. Furthermore, when the coating film of the aluminum oxynitride contained oxygen in an amount of less than 2 atomic %, the cavity had the facet degraded, possibly because the facet of the nitride semiconductor and the coating film of the aluminum oxynitride contacted each other less closely, and this caused heat and thus degraded the facet. Furthermore, when the coating film contained oxygen in an amount of more than 35 atomic %, the laser device provided a decreased COD level, possibly because the oxygen contained in the coating film oxidized the cavity's facet of the nitride semiconductor and thus caused a nonradiative recombination level.

Second Embodiment

The present embodiment provides a nitride semiconductor laser device similar in configuration to that of the first embodiment except that the former has a cavity with a light emitting facet coated with a coating film modified in configuration and a light reflecting facet provided with a film modified in configuration.

More specifically in the present embodiment the nitride semiconductor laser device has a cavity with a light emitting facet provided with a coating film formed of aluminum oxynitride and having a thickness of 6 nm. Furthermore the cavity has a light reflecting facet provided with a 12 nm thick aluminum oxynitride film deposited under the same conditions as the coating film coating the light emitting facet of the cavity and on the aluminum oxynitride film a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

Figure 9:
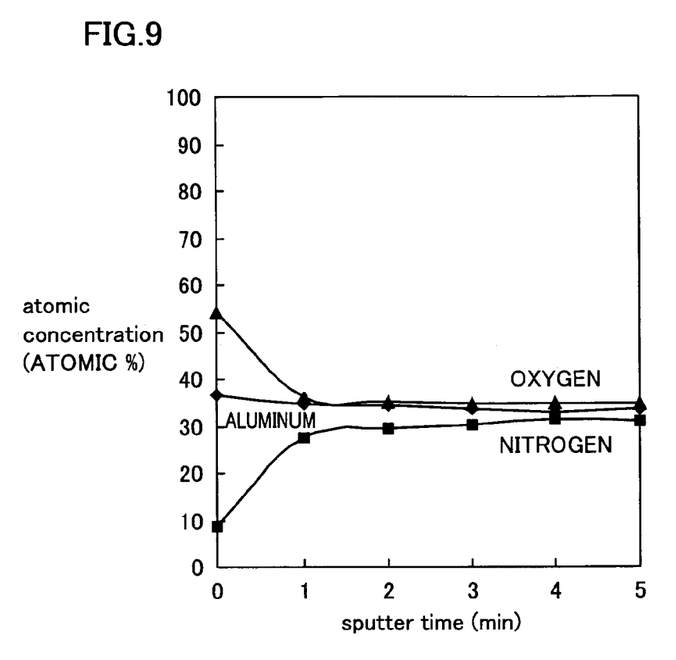
FIG. 9 represents a result of an analysis in composition, as seen depthwise, by AES of a coating film deposited on a light emitting facet of a cavity of the present nitride semiconductor laser device in a second embodiment.

FIG. 9 represents a result of an analysis in composition, as seen depthwise, by AES of the coating film deposited on the light emitting facet of the cavity of the nitride semiconductor laser device of the present embodiment. As shown in FIG. 9, the coating film contained aluminum, oxygen and nitrogen in amounts of 33.6 atomic %, 35.2 atomic %, and 31.2 atomic %, respectively, and had a substantially uniform composition as seen depthwise.

The nitride semiconductor laser device of the present embodiment was also aged for 300 hours (at 70° C. at 100 mW, CW driven) and its COD level was thereafter examined, similarly as has been described in the first embodiment. The nitride semiconductor laser device of the present embodiment after it was aged thermally saturated at an optical output of 330 mW, and has been confirmed to provide an improved COD level in comparison with that of the conventional nitride semiconductor laser device having a cavity with a light emitting facet provided with a coating film of AlN, as also observed after it was aged for 300 hours.

Third Embodiment

The present embodiment provides a nitride semiconductor laser device similar in configuration to that of the first embodiment except that the former has a cavity with a light emitting facet coated with a coating film modified in configuration and a light reflecting facet provided with a film modified in configuration.

More specifically in the present embodiment the nitride semiconductor laser device has a cavity with a light emitting facet provided with a coating film formed of aluminum oxynitride and having a thickness of 100 nm. Furthermore the cavity has a light reflecting facet provided with a 20 nm thick aluminum oxynitride film deposited under the same conditions as the coating film coating the light emitting facet of the cavity and on the aluminum oxynitride film a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

Figure 10:
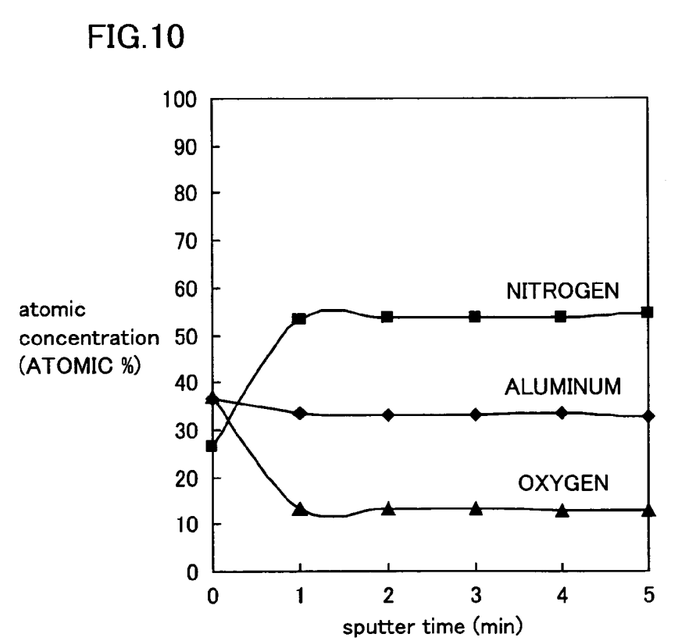
FIG. 10 represents a result of an analysis in composition, as seen depthwise, by AES of a coating film deposited on a light emitting facet of a cavity of the present nitride semiconductor laser device in a third embodiment.

FIG. 10 represents a result of an analysis in composition, as seen depthwise, by AES of the coating film deposited on the light emitting facet of the cavity of the nitride semiconductor laser device of the present embodiment. As shown in FIG. 10, the coating film contained aluminum, oxygen and nitrogen in amounts of 34 atomic %, 12 atomic %, and 54 atomic %, respectively, and had a substantially uniform composition as seen depthwise.

The nitride semiconductor laser device of the present embodiment was also aged for 300 hours (at 70° C. at 100 mW, CW driven) and its COD level was thereafter examined, similarly as has been described in the first embodiment. The nitride semiconductor laser device of the present embodiment after it was aged thermally saturated at an optical output of 333 mW, and has been confirmed to provide an improved COD level in comparison with that of the conventional nitride semiconductor laser device having a cavity with a light emitting facet provided with a coating film of AlN, as also observed after it was aged for 300 hours.

Fourth Embodiment

The present embodiment provides a nitride semiconductor laser device similar in configuration to that of the first embodiment except that the former has a cavity with a light emitting facet coated with a coating film modified in configuration and a light reflecting facet provided with a film modified in configuration.

More specifically in the present embodiment the nitride semiconductor laser device has a cavity with a light emitting facet provided with a coating film formed of aluminum oxynitride and having a thickness of 12 nm (with oxygen contained in an amount of 35 atomic %) and thereon a 60 nm thick aluminum oxide film. Furthermore the cavity has a light reflecting facet provided with a 6 nm thick aluminum oxynitride film deposited under the same conditions as the coating film coating the light emitting facet of the cavity and on the aluminum oxynitride film, a 80 nm thick aluminum oxide film is deposited, and furthermore, a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

The nitride semiconductor laser device of the present embodiment was also aged for 300 hours (at 70° C. at 100 mW, CW driven) and its COD level was thereafter examined, similarly as has been described in the first embodiment. The nitride semiconductor laser device of the present embodiment after it was aged thermally saturated at an optical output of 336 mW, and has been confirmed to provide an improved COD level in comparison with that of the conventional nitride semiconductor laser device having a cavity with a light emitting facet provided with a coating film of AlN, as also observed after it was aged for 300 hours.

Fifth Embodiment

The present embodiment provides a nitride semiconductor laser device similar in configuration to that of the first embodiment except that the former is adjusted to lase at a wavelength of 460 nm and that it has a cavity with a light emitting facet coated with a coating film modified in configuration and a light reflecting facet provided with a film modified in configuration. Note that the wavelength is adjusted by changing in composition ratio the AlGaInN of an AlGaInN multi quantum well active layer.

More specifically in the present embodiment the nitride semiconductor laser device has a cavity with a light emitting facet provided with a coating film formed of aluminum oxynitride and having a thickness of 50 nm thick to provide a reflectance adjusted to be approximately 10%. Furthermore the cavity has a light reflecting facet provided with a 6 nm thick aluminum oxynitride film deposited under the same conditions as the film coating the light emitting facet of the cavity and on the aluminum oxynitride film a 80 nm thick aluminum oxide film is deposited, and furthermore a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

The nitride semiconductor laser device of the present embodiment was also aged for 300 hours (at 70° C. at 100 mW, CW driven) and its COD level was thereafter examined, similarly as has been described in the first embodiment. The nitride semiconductor laser device of the present embodiment after it was aged thermally saturated at an optical output of 343 mW, and has been confirmed to provide an improved COD level in comparison with that of the conventional nitride semiconductor laser device having a cavity with a light emitting facet provided with a coating film of AlN, as also observed after it was aged for 300 hours.

The nitride semiconductor laser device of the present invention that lases at a wavelength of 460 nm can be employed as an excitation source for an illumination device.

Sixth Embodiment

The present embodiment provides a nitride semiconductor laser device similar in configuration to that of the first embodiment except that the former has a cavity with a light emitting facet coated with a coating film modified in configuration and a light reflecting facet provided with a film modified in configuration.

More specifically in the present embodiment the nitride semiconductor laser device has a cavity with a light emitting facet provided with a coating film formed of silicon oxynitride and having a thickness of 12 nm. Furthermore the cavity has a light reflecting facet provided with a 20 nm thick silicon oxynitride film deposited under the same conditions as the coating film coating the light emitting facet of the cavity and on the silicon oxynitride film a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

The coating film provided on the light emitting facet of the cavity of the nitride semiconductor laser device of the present embodiment was measured in composition by AES depthwise. It contained aluminum, oxygen and nitrogen in amounts of 34 atomic %, 3 atomic % and 63 atomic %, respectively, and had a substantially uniform composition as seen depthwise.

The nitride semiconductor laser device of the present embodiment was also aged for 300 hours (at 70° C. at 100 mW, CW driven) and its COD level was thereafter examined, similarly as has been described in the first embodiment. The nitride semiconductor laser device of the present embodiment after it was aged thermally saturated at an optical output of 302 mW, and has been confirmed to provide an improved COD level in comparison with that of the conventional nitride semiconductor laser device having a cavity with a light emitting facet provided with a coating film of AlN, as also observed after it was aged for 300 hours.

The present embodiment was also examined for COD level dependency of content of oxygen in the coating film, similarly as described in the first embodiment. More specifically, the nitride semiconductor laser device of the present embodiment having the coating film of the silicon oxynitride with oxygen contained therein in an mount variable from 0 atomic % to 50 atomic % was aged for 300 hours (at 70° C. at 100 mW, CW driven) and its COD level was thereafter measured. Basically, oxygen and nitrogen both bond to silicon. As such, while the coating film contains oxygen in a variable amount, the coating film contains silicon in a substantially invariable amount (in atomic %), and nitrogen will accordingly be contained in an amount (in atomic %) decreased by that (in atomic %) of oxygen contained that is increased.

The COD level dependency of an amount of oxygen contained in the coating film of the silicon oxynitride showed substantially the same tendency as that for the aluminum oxynitride as shown in FIG. 8. More specifically the laser device having a cavity with a light emitting facet provided with a coating film containing oxygen in an amount of at least 2 atomic % and at most 35 atomic % provided a tendency to provide an improved COD level while it was aged.

Seventh Embodiment

The present embodiment provides a nitride semiconductor laser device similar in configuration to that of the first embodiment except that the former has a cavity with a light emitting facet coated with a coating film modified in configuration and a light reflecting facet provided with a film modified in configuration.

More specifically in the present embodiment the nitride semiconductor laser device has a cavity with a light emitting facet provided with a coating film formed of aluminum oxynitride and having a thickness of 25 nm and thereon a 150 nm thick silicon nitride film. Furthermore the cavity has a light reflecting facet provided with a 25 nm thick aluminum oxynitride film deposited under the same conditions as the coating film coating the light emitting facet of the cavity, and on the aluminum oxynitride film, a 50 nm thick silicon nitride film is deposited, and thereon, a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

The coating film of aluminum oxynitride provided on the light emitting facet of the cavity of the nitride semiconductor laser device of the present embodiment was measured in composition by AES depthwise. It contained aluminum, oxygen and nitrogen in amounts of 34 atomic %, 3 atomic % and 63 atomic %, respectively, and had a substantially uniform composition as seen depthwise.

The nitride semiconductor laser device of the present embodiment was also aged for 300 hours (at 70° C. at 100 mW, CW driven) and its COD level was thereafter examined, similarly as has been described in the first embodiment. The nitride semiconductor laser device of the present embodiment after it was aged thermally saturated at an optical output of 350 mW, and has been confirmed to provide an improved COD level in comparison with that of the conventional nitride semiconductor laser device having a cavity with a light emitting facet provided with a coating film of AlN, as also observed after it was aged for 300 hours.

Note that if film of silicon nitride is deposited to have a thickness of 5 nm or smaller it is hardly formed uniformly. As such, preferably it is deposited to have a thickness of at least 5 nm.

Furthermore, if the nitride semiconductor laser device of the present embodiment is aged for a long period of time, it may have the coating film of aluminum oxynitride oxidized by moisture or the like present in the ambient in which the laser device is placed, and thus varied in index of refraction. Accordingly, when protecting the coating film against moisture is considered, the film of silicon nitride is preferably deposited to have a thickness of at least 40 nm. Furthermore when film deposition time and the like are considered the film of silicon nitride is preferably deposited to have a thickness of at most 300 nm.

Furthermore while in the present embodiment a coating film formed of aluminum oxynitride underlies a film formed of silicon nitride, the present invention may be implemented with the silicon nitride film replaced with a silicon oxynitride film. If the coating film formed of aluminum oxynitride underlies the silicon oxynitride film, and protecting the coating film against moisture is considered, the silicon oxynitride film is preferably provided to contain oxygen in an amount of at most 40 atomic %. Furthermore the silicon oxynitride film is preferably deposited to have a thickness of at least 5 nm, more preferably at least 40 nm for a ground similar to that for the silicon nitride film described above. Furthermore the silicon oxynitride film is preferably deposited to have a thickness of at most 300 nm for a ground similar to that for the silicon nitride film described above.

Furthermore a nitride semiconductor laser device is fabricated (as a first nitride semiconductor laser device) to have a cavity with a light emitting facet provided with a coating film formed of aluminum oxynitride and having a thickness of 25 nm, a 150 nm thick silicon nitride film overlying the coating film, and a 30 nm thick aluminum oxide film overlying the silicon nitride film.

Furthermore a nitride semiconductor laser device is fabricated (as a second nitride semiconductor laser device) to have a cavity with a light emitting facet provided with a coating film formed of aluminum oxynitride and having a thickness of 25 nm, a 150 nm thick silicon nitride film overlying the coating film, and a 150 nm thick aluminum oxide film overlying the silicon nitride film.

Furthermore a nitride semiconductor laser device is fabricated (as a third nitride semiconductor laser device) to have a cavity with a light emitting facet provided with a coating film formed of aluminum oxynitride and having a thickness of 25 nm, a 150 nm thick silicon nitride film overlying the coating film, and a 30 nm thick silicon oxide film overlying the silicon nitride film.

Furthermore a nitride semiconductor laser device is fabricated (as a fourth nitride semiconductor laser device) to have a cavity with a light emitting facet provided with a coating film formed of aluminum oxynitride and having a thickness of 25 nm, a 150 nm thick silicon nitride film overlying the coating film, and a 150 nm thick silicon oxide film overlying the silicon nitride film.

The first to fourth nitride semiconductor laser devices thus fabricated also provided a result similar to that described above.

Note that the first to fourth nitride semiconductor laser devices each had the cavity with a light reflecting facet provided with films identical in configuration to those provided to the light reflecting facet of the cavity of the nitride semiconductor laser device of the seventh embodiment.

It should be noted that the aluminum oxynitride discussed in the present invention includes AlN with aluminum oxide mixed therewith and thus present therein, AlN with aluminum oxynitride present therein in the form of a crystal, and AlN with aluminum oxide and aluminum oxynitride present therein, and the present invention may adopt any form thereof.

Furthermore the above embodiments have been described with a coating film formed of aluminum oxynitride containing oxygen in an amount substantially uniform as seen depthwise, the coating film may be structured in multiple layers that contain oxygen in an amount graded and thus varying as seen depthwise or contain oxygen in different amounts, respectively.

Furthermore the above embodiments have mainly been described with a coating film formed of film of a silicon oxynitride or an aluminum oxynitride, the coating film may be a film of an aluminum-silicon oxynitride which is obtained by sputtering a target formed of a silicon-aluminum mixture and thus contains aluminum and silicon.

In doing so, controlling the silicon and the aluminum in the target or the silicon-aluminum mixture in composition can control the coating film in composition. Furthermore while in the above description a silicon-aluminum mixture is used as a target, sputtering to deposit film or the like can dispense with the silicon-aluminum mixture as the target; a target formed of silicon and that formed of aluminum may be arranged for example in a honeycomb, alternately, or the like, and simultaneously sputtered to provide a film formed of an aluminum and silicon-containing, aluminum-silicon oxynitride to serve as the coating film.

The present invention is applicable for example to a nitride semiconductor laser device lasing at a wavelength of the ultraviolet range to the green range, a nitride semiconductor laser device of a broad area type having a stripe of approximately several tens μm in width, a nitride semiconductor light emitting diode device lasing at a wavelength of the ultraviolet range to the red range, or the like.

Furthermore the coating film of the present invention would also be effectively applied on a facet of a nitride semiconductor laser device that is provided with a window structure (a structure averaging a composition in a vicinity of a facet of an active layer, such as used for example in a GaAs semiconductor laser device, to provide an increased bandgap therearound to provide an improved COD level).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device having a light emitting portion coated with a coating film, said coating film having a first surface and an opposing second surface, wherein said light emitting portion is formed of a nitride semiconductor, and said coating film is formed of an aluminum oxynitride film, and the first surface of said coating film is in direct contact with said light emitting portion, wherein a nitride film is in contact with the opposing second surface of said coating film, said nitride film is in direct contact with said coating film, the nitride semiconductor light emitting device is a nitride semiconductor laser device, and said light emitting portion is a facet of a cavity, the facet being a primary light emitting surface of the nitride semiconductor laser device.

2. The nitride semiconductor light emitting device according to claim 1, wherein said aluminum oxynitride film contains oxygen in an amount of at least 2 atomic % and at most 35 atomic %.

3. The nitride semiconductor light emitting device according to claim 1, wherein said aluminum oxynitride film contains oxygen in an amount of at least 2 atomic % and at most 15 atomic %.

4. The nitride semiconductor light emitting device according to claim 1, wherein said nitride film is a film formed of a nitride of at least one of silicon and aluminum.

5. The nitride semiconductor light emitting device according to claim 4, wherein said nitride film is a film formed of silicon nitride and having a thickness of at least 5 nm.

6. A nitride semiconductor light emitting device having a light emitting portion coated with a coating film, said coating film having a first surface and an opposing second surface, wherein said light emitting portion is formed of a nitride semiconductor, and said coating film is formed of an aluminum oxynitride, and the first surface of said coating film is in direct contact with said light emitting portion, wherein a film is in contact with the opposing second surface of said coating film, said film is in direct contact with said coating film, the nitride semiconductor light emitting device is a nitride semiconductor laser device, and said light emitting portion is a facet of a cavity, the facet being a primary light emitting surface of the nitride semiconductor laser device, said film being in contact with the opposing second surface of said coating film is formed of a nitride.

7. The nitride semiconductor light emitting device according to claim 6, wherein said aluminum oxynitride contains oxygen in an amount of at least 2 atomic % and at most 35 atomic %.

8. The nitride semiconductor light emitting device according to claim 6, wherein said aluminum oxynitride contains oxygen in an amount of at least 2 atomic % and at most 15 atomic %.

9. A nitride semiconductor light emitting device having a light emitting portion coated with a coating film, said coating film having a first surface and an opposing second surface, wherein said light emitting portion is formed of a nitride semiconductor, and said coating film is formed of an aluminum oxynitride film, and the first surface of said coating film is in direct contact with said light emitting portion, wherein a nitride film is in contact with the opposing second surface of said coating film, said nitride film is in direct contact with said coating film, the nitride semiconductor light emitting device is a nitride semiconductor laser device, and said light emitting portion is a facet of a cavity, the facet being a primary light emitting surface of the nitride semiconductor laser device,
wherein said aluminum oxynitride film contains oxygen in an amount of at least 2 atomic % and at most 35 atomic %, and
wherein said nitride film has a thickness of at least 5 nm.

10. The nitride semiconductor light emitting device according to claim 9, wherein said aluminum oxynitride film contains oxygen in an amount of at least 2 atomic % and at most 15 atomic %.

11. The nitride semiconductor light emitting device according to claim 9, wherein said nitride film is a film formed of a nitride of at least one of silicon and aluminum.

12. The nitride semiconductor light emitting device according to claim 11, wherein said nitride film is a film formed of silicon nitride.

13. A nitride semiconductor light emitting device having a light emitting portion coated with a coating film, said coating film having a first surface and an opposing second surface, wherein said light emitting portion is formed of a nitride semiconductor, and said coating film is formed of an aluminum oxynitride, and the first surface of said coating film is in direct contact with said light emitting portion, wherein a nitride film is in contact with the opposing second surface of said coating film, said nitride film is in direct contact with said coating film, the nitride semiconductor light emitting device is a nitride semiconductor laser device, and said light emitting portion is a facet of a cavity, the facet being a primary light emitting surface of the nitride semiconductor laser device,
wherein said aluminum oxynitride contains oxygen in an amount of at least 2 atomic % and at most 35 atomic %, and
wherein said nitride film has a thickness of at least 5 nm.

14. The nitride semiconductor light emitting device according to claim 13, wherein said aluminum oxynitride contains oxygen in an amount of at least 2 atomic % and at most 15 atomic %.

15. The nitride semiconductor light emitting device according to claim 13, further comprising:
an oxide film formed on said nitride film.

16. The nitride semiconductor light emitting device according to claim 13, wherein said film being in contact with the opposing second surface of said coating film is formed of a nitride of at least one of silicon and aluminum.

17. The nitride semiconductor light emitting device according to claim 13, further comprising:
an oxynitride film formed on said nitride film.

* * * * *